United States Patent
Mueller et al.

(10) Patent No.: US 10,426,025 B2
(45) Date of Patent: Sep. 24, 2019

(54) MANUFACTURE OF ELECTRONIC CIRCUITS

(71) Applicant: Siemens Aktiengesellschaft, Munich (DE)

(72) Inventors: Bernd Mueller, Falkenberg (DE); Michael Niedermayer, Glienicke (DE); Ulrich Wittreich, Velten (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/555,601

(22) PCT Filed: Feb. 11, 2016

(86) PCT No.: PCT/EP2016/052897
§ 371 (c)(1),
(2) Date: Sep. 5, 2017

(87) PCT Pub. No.: WO2016/139040
PCT Pub. Date: Sep. 9, 2016

(65) Prior Publication Data
US 2018/0049315 A1  Feb. 15, 2018

(30) Foreign Application Priority Data

Mar. 2, 2015  (DE) .......... 10 2015 203 680

(51) Int. Cl.
*B23K 31/02*  (2006.01)
*H05K 1/02*  (2006.01)
(Continued)

(52) U.S. Cl.
CPC ......... *H05K 1/0268* (2013.01); *B23K 1/0016* (2013.01); *G01K 13/00* (2013.01);
(Continued)

(58) Field of Classification Search
CPC .... H05K 1/0268; H05K 3/341; H05K 1/0269; H05K 2203/176; H05K 2203/163; G01K 13/00; B23K 1/0016; B23K 2101/36-42
(Continued)

(56) References Cited

U.S. PATENT DOCUMENTS 4,180,199 A * 12/1979 O'Rourke ................ B23K 3/08
228/102
4,944,447 A * 7/1990 Thome ..................... B23K 1/19
228/103
(Continued)

FOREIGN PATENT DOCUMENTS

DE  102009003023 A1 * 11/2010 ........... B23K 1/0016
DE  102013211834 A1  12/2014 ............... B23K 1/08
(Continued)

OTHER PUBLICATIONS

International Search Report and Written Opinion, Application No. PCT/EP2016/052897, 20 pages, dated May 17, 2016.
(Continued)

*Primary Examiner* — Kiley S Stoner
(74) *Attorney, Agent, or Firm* — Slayden Grubert Beard PLLC

(57) ABSTRACT

The present disclosure relates manufacturing for electronic circuit in a production installation. The teachings thereof may be embodied in a method for manufacturing an electronic circuit in a production installation comprising: detachably connecting a circuit carrier to a measuring module before performance of a process step; performing a measurement with the measuring module during the performance of the process step; and removing the measuring module from the circuit carrier after termination of the process step.

7 Claims, 3 Drawing Sheets

(51) Int. Cl.
　　*B23K 1/00*　　　(2006.01)
　　*G01K 13/00*　　(2006.01)
　　*H05K 3/34*　　　(2006.01)
　　*B23K 101/42*　　(2006.01)

(52) U.S. Cl.
　　CPC .......... *H05K 1/0269* (2013.01); *H05K 3/341* (2013.01); *B23K 2101/42* (2018.08); *H05K 2203/163* (2013.01); *H05K 2203/176* (2013.01)

(58) Field of Classification Search
　　USPC ...... 228/102–105, 8–12, 179.1–180.22, 260, 228/37
　　See application file for complete search history.

(56) References Cited

U.S. PATENT DOCUMENTS

| | | | | |
|---|---|---|---|---|
| 5,234,151 | A | 8/1993 | Spigarelli | 228/103 |
| 5,388,468 | A * | 2/1995 | Sasson | B23K 1/085 |
| | | | | 228/56.5 |
| 6,483,324 | B1 * | 11/2002 | Mitter | G01N 27/225 |
| | | | | 324/689 |
| 7,975,380 | B2 * | 7/2011 | Lee | G01R 1/07342 |
| | | | | 29/842 |
| 2001/0045445 | A1 * | 11/2001 | Caletka | B23K 3/08 |
| | | | | 228/103 |
| 2003/0025518 | A1 * | 2/2003 | Berkely | G01R 31/046 |
| | | | | 324/762.01 |
| 2003/0034381 | A1 * | 2/2003 | Nakatsuka | B23K 1/085 |
| | | | | 228/180.1 |
| 2004/0257103 | A1 * | 12/2004 | Park | G01R 1/0483 |
| | | | | 324/756.05 |
| 2005/0077907 | A1 * | 4/2005 | Parker | G01R 31/2853 |
| | | | | 324/538 |
| 2005/0242823 | A1 * | 11/2005 | Parker | G01R 31/046 |
| | | | | 324/530 |
| 2005/0253616 | A1 * | 11/2005 | Parker | G01R 31/048 |
| | | | | 324/754.28 |
| 2006/0114008 | A1 * | 6/2006 | Fujii | G01R 31/2886 |
| | | | | 324/754.03 |
| 2008/0286886 | A1 * | 11/2008 | Carey | H01L 22/14 |
| | | | | 438/15 |
| 2011/0031297 | A1 | 2/2011 | Nakaya et al. | 228/102 |
| 2013/0245988 | A1 | 9/2013 | Lai | 702/150 |
| 2014/0198424 | A1 * | 7/2014 | Hugo | H05K 13/0465 |
| | | | | 361/104 |
| 2015/0007662 | A1 * | 1/2015 | Murphy | G01M 7/027 |
| | | | | 73/663 |
| 2018/0049356 | A1 * | 2/2018 | Mori | B23K 1/0016 |

FOREIGN PATENT DOCUMENTS

| | | | | |
|---|---|---|---|---|
| EP | 2127800 A1 | 12/2009 | ............. | B23K 37/04 |
| JP | 2001196721 A | 7/2001 | ............... | H05K 3/00 |
| WO | 2016/139040 A1 | 9/1916 | ............... | H05K 1/02 |

OTHER PUBLICATIONS

Chinese Office Action, Application No. 201680013268.6, 6 pages, dated Dec. 7, 2018.

* cited by examiner

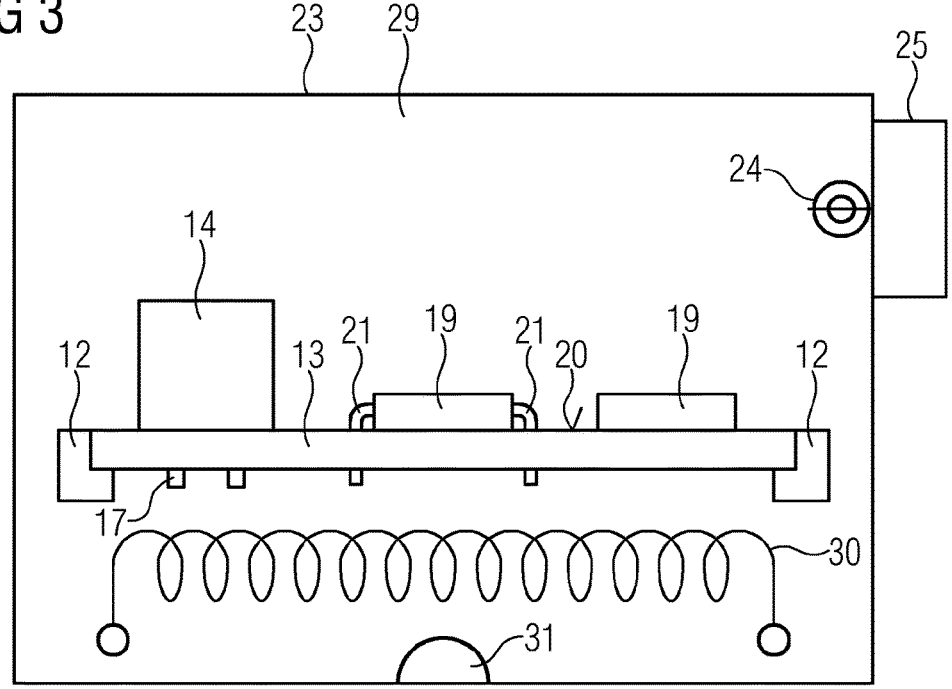
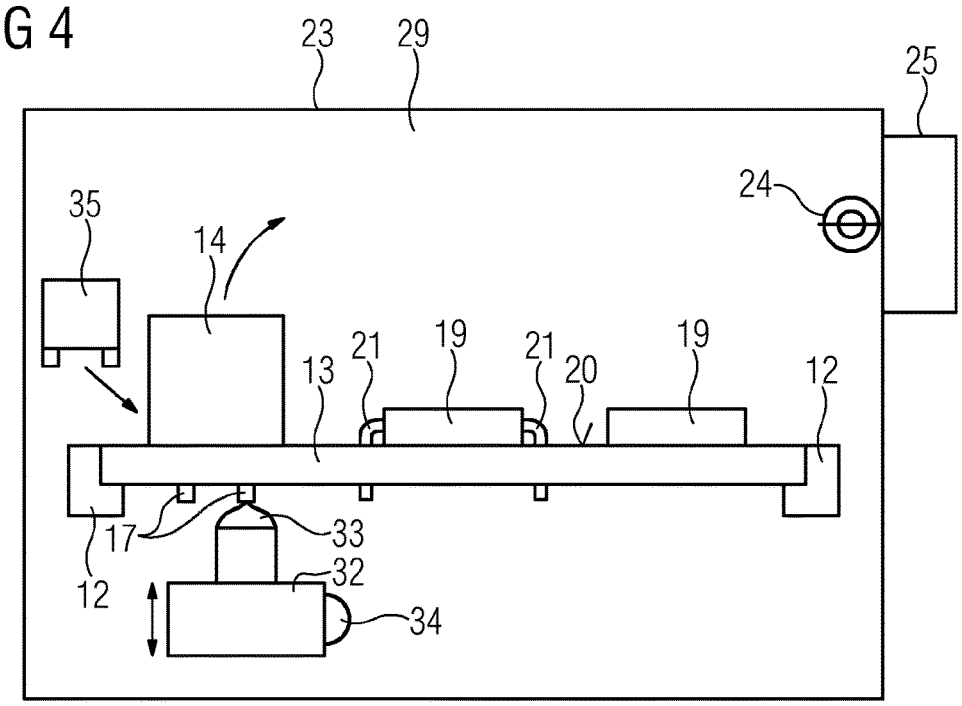

MANUFACTURE OF ELECTRONIC CIRCUITS

CROSS-REFERENCE TO RELATED APPLICATIONS

This application is a U.S. National Stage Application of International Application No. PCT/EP2016/052897 filed Feb. 11, 2016, which designates the United States of America, and claims priority to DE Application No. 10 2015 203 680.4 filed Mar. 2, 2015, the contents of which are hereby incorporated by reference in their entirety.

TECHNICAL FIELD

The present disclosure relates manufacturing for electronic circuit in a production installation.

BACKGROUND

Subassemblies having electronic circuits, methods for the manufacture thereof and production installations that are used to perform these methods are known generally from the prior art (electronic assembly). In addition, it is common to subject such methods to quality assurance procedures. For example, DE 10 2013 211 834 A1 discloses that, for the purpose of quality assurance, instead of printed circuit boards fitted with components, test boards can be channeled through production facilities provided with sensors that permit specific statements about the production process taking place. These sensor boards ascertain data and measured values in addition to the permanently installed sensors in the production installation and thus allow an examination of the production process as such and of the reliable operation of the sensors installed in the production installation. In this way, reference data can be obtained for a production process that are taken into consideration in subsequent production steps.

SUMMARY

This teachings of the present disclosure may be embodied in circuit carriers subjected to at least one process step for manufacturing the electronic circuit. Typical process steps that are used in electronics production may include fitting a circuit carrier with elements, applying joining media, e.g. printing a solder paste on the circuit carrier, soldering, which can be selectively effected using a solder wave apparatus, for example, or in a reflow soldering furnace, or applying flux to electrical contacts. The circuit carriers used may be printed circuit boards, for example. However, circuit carriers within the context of this disclosure may mean other structural components that perform the function of an electronic circuit being constructed thereon. As such, there is the possibility of using package parts as carriers of an electronic circuit, for example.

In addition, the teachings of the present disclosure relate to subassemblies with an electronic circuit that has a circuit carrier to which elements of the electronic circuit are connected. Such a circuit can be regarded as a product to be manufactured in the method specified above. The teachings also relate to production installations for manufacturing an electronic circuit on a circuit carrier, in which at least one process step for manufacture can be performed. This production installation is therefore also suitable for performing the method cited above.

The teachings of the present disclosure may enable a method for manufacturing electronic circuits that allows comparatively close-meshed quality control for the production process, a subassembly having an electronic circuit that simplifies quality management during the production process, and/or a production installation that allows improved quality management for a production process for electronic assembly.

For example, a method for manufacturing an electronic circuit in a production installation, may include: a circuit carrier (13) is made available, the circuit carrier (13) is subjected to at least one process step for manufacturing the electronic circuit, characterized in that the circuit carrier (13) is detachably connected to a measuring module (14) before the performance of the at least one process step, the measuring module (14) performs a measurement during the performance of the at least one process step, and the measuring module (14) is removed from the circuit carrier after termination of the at least one process step.

In some embodiments, the measuring module (14) accesses an electronic component (38), which is part of the electronic circuit on the circuit carrier (13), during the at least one process step.

In some embodiments, the measuring module (14) is replaced by another electronic module (35) after said measuring module has been removed from the circuit carrier.

In some embodiments, the measuring module (14) produces measurement data during the measuring and forwards said measurement data to the production installation via an interface (24).

In some embodiments, the measuring module (14) produces measurement data during the measurement, processes said measurement data and takes the result of the processing as a basis for forwarding data describing the measurement result or control commands for influencing the at least one process step to the production installation via a data interface (13).

In some embodiments, measurement data that come from a sensor (22) outside the measuring module are also processed in the measuring module (14).

In some embodiments, the measuring module is secured by adhesive bonding, hook and loop fastening, insertion or by means of magnetic forces.

In some embodiments, the at least one process step consists of applying solder to the circuit carrier, fitting components to the circuit carrier, wetting the circuit carrier with a flux or forming solder joints on the circuit carrier.

In some embodiments, the measuring module is used to measure a temperature and/or a position and/or an acceleration.

As another example, the teachings may be embodied in a subassembly having an electronic circuit that has a circuit carrier (13) to which elements (19) of the electronic circuit are connected, characterized in that the circuit carrier (13) is detachably connected to a measuring module (14), and the measuring module (14) is operational, in terms of its power supply and its measured value generation, independently of the electronic circuit.

In some embodiments, the measuring module (14) has an autonomous energy source (43).

In some embodiments, an electronic memory module (17) and/or an electronic transmission module (40) and/or an electronic reception module (41) that is in breakable electrical contact with the measuring module (14) is/are provided on the circuit carrier (13).

As another example, teachings of the present disclosure may be embodied in a production installation for manufacturing an electronic circuit on a circuit carrier (13), in which at least one process step for manufacture can be performed, characterized in that the production installation has a measuring module (14) having at least one sensor, which measuring module is mobile in the production installation, such that it can be detachably fixed to the circuit carriers (13) to be manufactured, and has a data interface (13) via which a data link to the measuring module (14) can be set up.

In some embodiments, a sensor (22) mounted in the production installation is provided that can communicate with the measuring module (14) via the data interface (24).

BRIEF DESCRIPTION OF THE DRAWINGS

Further details of the teachings herein are described below with reference to the drawings. Like or corresponding drawing elements are each provided with the same reference symbols and are explained repeatedly only in so far as differences arise between the individual figures, in which:

FIGS. 1 to 4 schematically show a side view of various process steps in the manufacture of an electronic subassembly as exemplary embodiments of the method according to the teachings of the present disclosure, wherein an exemplary embodiment of the production installation is used and an exemplary embodiment of the subassembly is manufactured, FIG. 5 schematically shows a partial sectional view of a detail from another exemplary embodiment of the subassembly according to the teachings of the present disclosure.

DETAILED DESCRIPTION

Figure 1:
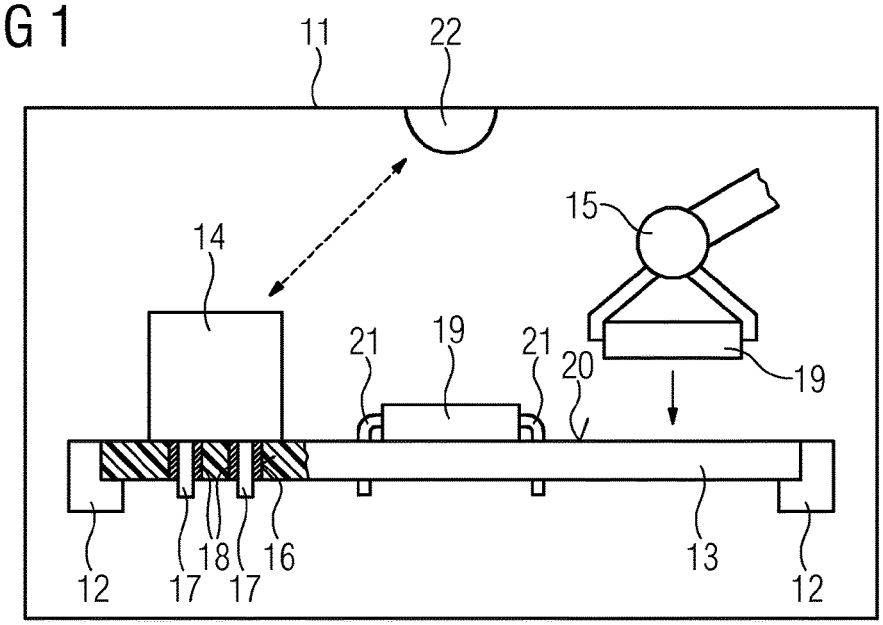

In some embodiments, a circuit carrier is detachably connected to a measuring module before the performance of at least one process step in the production installation. A measuring module within this disclosure means a subassembly that can be used to perform a measurement. For measurement, the measuring module may include at least one sensor. The measurement is performed by the measuring module independently. Although the electronic circuit on the circuit carrier may not yet be finished during the process step and the functions thereof therefore cannot yet be carried out or at least cannot yet be carried out completely, the measuring module may be capable of undertaking the task of performing a measurement. The measuring module carries out this measurement during the execution of the at least one process step, so that during the process step additional measurement data are obtained that are not ascertained by sensors permanently installed in the production installation.

After termination of the at least one process step (and possibly of still further process steps), the measuring module may be removed from the circuit carrier. For this purpose, the detachable connection is provided. The advantage of this measure is that the measuring module, following removal from the circuit carrier, is available for further circuit carriers that are to be manufactured, to which the measuring module can be detachably fitted once more.

In some embodiments, the measuring technology used in the measuring module may therefore be of comparatively high quality, since it does not remain on the circuit carrier and hence does not directly influence the piece costs of the circuit carrier. Rather, the purchase of the measuring module or of multiple measuring modules is investment that has only an indirect effect on the whole series of circuit carriers.

In some embodiments, high-quality measuring modules can be used to produce measurement data that describe the states in the direct surroundings of the circuit carrier. These states can be used to directly control the at least one process step. There can be an immediate reaction to quality problems during the process step.

In some embodiments, measurement results from sensors may be taken into consideration as well, said measurement results being obtained in a known manner by sensors that are permanently installed in the production installation. Collective evaluation of the measured values further improves the possibilities for qualitative statements about the process step taking place.

In some embodiments, the measuring module may access an electronic component, which is part of the electronic circuit on the circuit carrier, during the at least one process step. This may accordingly be an electronic component whose operation during the relevant process step is already ensured, at least in respect of the intended scope of the access via the measuring module. The access can be effected for functional testing of this component, for example, to involve a measured value that describes the proper functioning of the component. In some embodiments, the component may be used for a function that makes certain of the work of the measuring module. By way of example, the component could be used for storing data that have been produced by the measuring module. In some embodiments, these data are then also available for later process steps when the measuring module is already removed from the circuit carrier. The component could also be an antenna.

A component within the context of this disclosure means a functional unit that makes the access by the measuring module available for the purpose of using the function required by the measuring module. This functional unit can also consist of multiple elements.

In some embodiments, the measuring module may be replaced by another electronic module after said measuring module has been removed from the circuit carrier. This other electronic module can likewise undertake measurement functions, for example, that are needed following completion of the manufacture. By way of example, measured values could be useful for the later transport or operation of the circuit carrier. The measured values can be produced using cheaper sensors, however, which do not have to withstand the ambient temperatures of the stated process step (for example in the case of reflow soldering), for example. The other electronic module can be configured more cheaply for that reason.

In some embodiments, the measuring module produces measurement data during the measuring and forwards said measurement data to the production installation via an interface. This may allow the ascertained measurement data to be evaluated during the process step and also to be available for controlling the process step. In this case, a control unit may be used which is part of the production installation. This control installation can also process, besides the measurement data of the measuring module, further data that, by way of example, are ascertained by sensors permanently installed in the production installation.

In some embodiments, there is an alternative for transferring the measurement data via an interface including storage of the measurement data in the measuring module or, as already mentioned, on the circuit carrier. In this case, the measurement data are available for an evaluation that follows the process step. This too allows quality control to be performed for production processes that are already running with optimized process parameters. By way of example, ageing-related quality fluctuations in the production installation can be detected in this manner.

In some embodiments, the measuring module may produce measurement data during the measurement, to process said measurement data and to take the result of the processing as a basis for forwarding data describing the measurement result to the production installation via an interface. In this case, the measuring module does not deliver the measurement data themselves to the production installation, so that said measurement data result in the generation of control commands only at that location in the course of a data processing, but rather the measuring module itself already has a device for data processing (intelligent measuring module). By way of example, only the departure from specific tolerance ranges can be sent from the measuring module to the production installation, such as e.g. a diagnosis feature for "offset detected in X-Y plane". The control commands are then produced as a reaction by the control unit, such as e.g. "correct offset in X-Y plane".

In some embodiments, the measuring module takes the measurement data as a basis for even forwarding control commands for influencing the at least one process step to the production installation via the interface. In this case, the measuring module may be hierarchically embedded in a control environment for the production installation, so that the control commands are implemented directly by the production installation. Another possibility is for the control command to be initially forwarded to the control apparatus of the production installation via the interface, so that the sum of the control commands converges in the control apparatus.

In some embodiments, measurement data come from a sensor outside the measuring module and may be processed in the measuring module as well. Other sensors may be either other measuring modules that are mounted on the circuit carrier that is in the process step or from other circuit carriers that are likewise in the process step. In some embodiments, sensors may be permanently installed in the production installation and forward the measurement data to the measuring module via the interface.

In some embodiments, the interface of the measuring module ensures the transmission of data. Said interface may be wireless or wired. A wireless embodiment may simplify handling of the measuring module during mounting on the circuit carrier, for example. Handling of the circuit carrier fitted with the measuring module is also simplified thereby. A wired interface may have increased reliability during the transmission of the measurement data.

In some embodiments, the coupling of the measuring module to other sensors may be used for various purposes. By way of example, the comparison of measurement data allows calibration of the sensors (outside and inside the measuring module). In this case, sensors having the highest measurement accuracy can be granted a priority. In some embodiments, the measurement data produced by the measuring module at the location of the circuit carrier may be granted a priority, while fixed sensors of the production facility, which can generate measurement errors on account of the distance from the circuit carrier, are calibrated using the measurement data produced by the measuring module. The recording of a data history makes it furthermore possible to correct a drift in the measured values, for example, that is brought about by ageing of the sensors in the production installation.

In some embodiments, the measuring module can be secured to the circuit carrier by adhesive bonding, hook and loop fastening, insertion, or by means of magnetic forces. All of these connections may be broken again and therefore allow repeated use of the measuring module.

In some embodiments, the at least one process step to be examined may include applying solder to the circuit carrier, fitting components to the circuit carrier, wetting the circuit carrier with a flux, or forming solder joints on the circuit carrier (by means of wave soldering or reflow soldering). These process steps are usually required for the manufacture of electronic circuits. The measuring module can perform only one of the cited process steps or several of these process steps in succession, the measuring module also being able to accommodate multiple sensors that are matched to the requirements in different process steps.

In some embodiments, a circuit carrier that carries the subassembly may be detachably connected to a measuring module. In some embodiments, the measuring module is operational, in terms of its power supply and its measured value generation, independently of the electronic circuit. This subassembly and the measuring module detachably mounted thereon can be used to perform the method specified above. The advantages cited in connection with the methods specified above can be achieved thereby.

A breakable connection within the disclosure means connections whose functionality allows repeated breaking and making of the connection. In this case, neither the circuit carrier nor the measuring module must be destroyed or damaged, so that the circuit carrier can be supplied to its intended function following the removal of the measuring module. The measuring module is intended to be repeatedly useable after performance of the process step in which the measured values are intended to be generated, to be detachably connected to another circuit carrier that has not yet undergone said process step.

In some embodiments, the measuring module may have an autonomous energy source. The measuring module does not have to have contact made with it by an external power supply during the performance of the measurements during the process step. The autonomous energy source makes certain of the operation of the measuring module during the process step. The autonomous energy source used can be, by way of example, an energy store such as an electrical battery. This can be provided with a charger that allows wireless charging of the measuring module.

Another possibility is for an energy transducer to be provided that, by way of example, converts thermal energy from the process step (e.g. in the case of reflow soldering) into electrical energy for the measuring module. The energy transducer can also be used as a charger for an energy store in the measuring module, so that even in times in which the energy transducer does not produce enough energy it is possible to use the energy store to make the energy needed for operation available in the measuring module.

In some embodiments, an electronic memory module and/or an electronic transmission module and/or an electronic reception module (this also includes an electronic transmission and reception module) may be in breakable electrical contact with the measuring module provided on the circuit carrier. These are therefore components that are intended to perform a particular function on the circuit carrier after it has been finished. These can, provided that this function can already be retrieved during the production step, be used by the measuring model when the measuring module has electrical contact made with it by them. Naturally, this making of electrical contact also needs to be embodied in breakable form, since the measuring module is intended to be removed from the circuit carrier following completion of the process module.

In some embodiments, the individual modules may each be embodied on the circuit carrier as individual elements or subassemblies in a form electrically isolated from one another. Alternatively, these functions may also be integrated in a subassembly or an element that has as a whole electrical contact made with it by the measuring module, however. A transmission module ensures unidirectional communication with the production installation. This is a prerequisite for the measuring module being able to forward measurement data, measurement results or control commands to the production facility. If one transmission and reception module or a transmission module and a reception module is/are provided, the measuring module can also receive data from the production installation. By way of example, the production installation can retrieve different measurement functions of the measuring module when there is occasion for a particular measurement for quality assurance for the process step taking place. As a result, the transmitted data rate can be decreased, since the measuring module only needs to perform measurements as required.

In some embodiments, a memory module can be used to store measured values. These measured values can be evaluated either by the measuring module itself or by the production facility. It is possible to use a measurement data history to ascertain, by way of example, whether there are drifting process parameters that need to be corrected in the event of doubt. It is also possible to use the measurement data for calibrating the sensors in the measuring module or external sensors from the production installation (as already described).

If the further modules (memory module and/or transmission module and/or reception module) are not provided on the circuit carrier, they may also be integrated in the measuring module. These are then removed from the circuit carrier again together with the sensors after the process step has taken place. In some embodiments, all these components of the measuring module are accommodated in a shared package.

In some embodiments, a production installation a measuring module having at least one sensor, which measuring module is mobile in the production installation. This mobility ensures that the measuring module can be detachably fixed on the circuit carriers to be manufactured and can remain permanently connected to the circuit carrier during a process step to be performed in the production installation. Subsequently, the detachable fixing allows removal of the measuring module and mounting on another circuit carrier that is to be manufactured.

In some embodiments, the production installation has a data interface with a data link to the measuring module. This allows a data link to the measuring module to be made during the performance of said process step, so that the production installation can evaluate these data for the purpose of process control. The associated advantages have already been described in connection with the method according to the invention specified above.

In some embodiments, a sensor is mounted in the production installation and communicates with the measuring module via the data interface. This also allows a data link to be set up between the permanently mounted sensor and the measuring module, the communication of the different measuring devices (i.e. measuring module, permanently mounted sensors) being able to be used in the manner already described for the subassembly to calibrate the measuring devices and to correct measurement data.

FIG. 1 schematically depicts a component fitting machine 11 as a box. In this component fitting machine, there is a transport system 12 (e.g. a pin chain conveyor system) for a printed circuit board as circuit carrier 13. This circuit carrier 13 may have been provided with a measuring module 14 before actually being introduced into the component fitting machine 11. Alternatively, it is also possible for a gripping arm 15 to position the measuring module 14 on the circuit carrier 13, preferably as part of a first mounting action. For this purpose, the circuit carrier has two holes 16, the measuring module having two pins 17 that ensure exact positioning of the measuring module 14 on the circuit carrier 13. The holes 16 can be augmented with a sleeve or coating 18. This firstly allows the fitting accuracy of the pins 17 to be increased.

Furthermore, the bushes or the coating 18 can be manufactured from an electrically insulating or electrically conductive material, depending on the function of the pins. An electrically insulating material lends itself when the pins 17 are not intended to come into electrical contact with regions of the circuit carrier 13. The manufacture of the coating 18 (or of the bushes) may be embodied in electrically conductive form when the pins 17 are intended to be electrically connected to components on the circuit carrier 13. In some embodiments, there is an electrical connection to electrical conductive paths inside the circuit carrier.

In the component fitting machine 11, the circuit carrier 13 is fitted with elements 19 that are put onto a mounting side 20 of the circuit carrier 13 by the gripping arm 15. The left-hand one of the two elements 19 may be a resistor, for example, which has contact wires 21 inserted through prepared openings (not depicted in more detail) in the circuit carrier in a manner not depicted in more detail. The right-hand one of the elements 19 has contacts on its underside, which faces the mounting side 20, suitable contact pads on the mounting side 20 of the circuit carrier 13, which have contact made with them by the contacts of the element 19.

The transport system 12 may be a pin chain conveyor system, for example, used to transport the circuit carrier 13 through the component fitting machine 11. To determine the position of the circuit carrier 13, the measuring module 14 may be equipped with a transmitter allowing location of the circuit carrier 13 and hence determination of the position thereof. For location, the component fitting machine 11 may accommodate a suitable reception device as a sensor 22 at a fixed position, the connection between the sensor 22 and the measuring module 14 being depicted by a dashed arrow.

Figure 2:
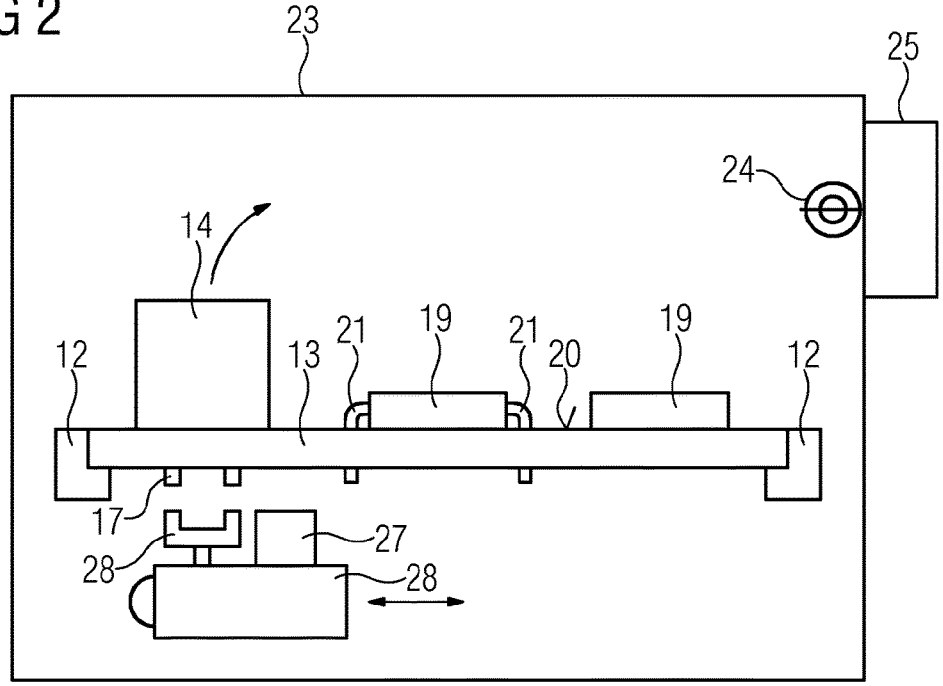

FIGS. 2 to 4 depict various stations in a soldering installation 23, which is again indicated schematically as a box. In the soldering installation 23 too, a transport system 12 is used on which the circuit carrier 13 is mounted. A sensor 22 for determining the position of the circuit carrier 13 in line with FIG. 1 may also be provided in the soldering installation 23. According to FIGS. 2 to 4, the soldering installation 23 has an interface 24 in the form of an antenna that is connected to a computer 25. This interface 24 can be used to transfer measurement signals, measurement results based on the evaluation of measurement signals in the measuring module 14 or control commands derived from said measurement signals wirelessly from the measuring module 14 to the computer 25, the computer 25 being able to have a database for the measurement results, control commands or measurement data, for example, in a manner that is not depicted. This database may additionally be filled with reference values, so that the computer can use the stored data and reference values to compute process parameters for the operation of the soldering installation or a modification to the manufacturing process for the circuit carrier.

The computer, which also includes a controller for the soldering installation, can be used to perform, by way of example, automated parameterization (transit time of the circuit carrier 13 through the soldering installation, temperature management for the soldering installation, positioning of installation components relative to the circuit carrier 13, etc.), preparation or programing of the installation (instead of teaching or iterative program creation on the installation itself). Short control loops in the production process furthermore allow quality assurance to be performed. The result is a reduction in rejects from products to be manufactured (circuit carriers), since action can be taken at a comparatively early time in the production process taking place. In this case, it is possible for detailed process details to be ascertained and stored on a product- or workpiece-specific basis throughout the process chain for manufacturing the circuit carrier.

In some embodiments, there is a reduction in maintenance effort for the installation, for example as a result of the elimination of program creation in situ. The maintenance intervals and also manually tracked process corrections may also be reduced, since errors that occur can be detected more quickly and the necessary measures can be initiated on the basis thereof. It is also possible to achieve energy savings during operation of the monitored installation, since heaters can be switched off in good time, for example, if the temperature profile during soldering can be predicted or is monitored at least in close-meshed fashion, for example. In this case, it is simultaneously possible for the process windows for the production process to be chosen to be narrower, since more empirical knowledge regarding the manufactured products emerges as the number of pieces increases.

In FIG. 2, the production step currently monitored in the soldering installation is represented by an application of flux. For this purpose, what is known as a fluxer 26 is provided in the soldering installation 23, which fluxer includes a supply of flux 27 into which the contact wires 21 can be dipped, for example. To determine a reference position for the fluxer 26 relative to the circuit carrier 13, the fluxer 26 additionally has a contact fork 28 that can be used to bring the fluxer 26 closer to the pins 17 of the measuring module 14 and to make contact with said fluxer. In some embodiments, the pins 17 are electrically conductive, so that the contact-making by means of the contact bridge 28 completes an electrical circuit that can be registered in the measuring module 14. The measuring module 14 can then send the signal "Reference position of fluxer correct" to the computer 25 via the interface 24 (for this purpose, the measuring module 14 likewise has a transmission module for transmitting said signal and other measurement results).

According to FIG. 3, a process step in the soldering installation is depicted in which the interior 29 of the soldering installation has its temperature controlled by means of a heating device 30. The temperature can firstly be monitored by a temperature sensor 31 installed at a fixed position in the soldering installation 23. To ascertain the prevailing temperatures on the circuit carrier 13 exactly, however, the measuring module 14 has an integrated temperature sensor that allows determination of the temperature in direct proximity to the circuit carrier 13. This allows control of the heating power of the heating device 30 solely on the basis of the result to be attained for heating the circuit carrier 13. This may allow greater process certainty given simultaneously optimally reduced energy consumption for the heating device 30.

In some embodiments, the heating device can be used to raise the temperature in the interior 29 to the extent that reflow soldering, for example of the element 19 using SMT technology, is successful. In some embodiments, the heating of the circuit carrier 13 can be used merely for controlling the temperature of the circuit carrier as a substrate for elements. In a subsequent step, it is then possible, as depicted in FIG. 4, for a wave soldering device 32 to be used to form local solder joints.

In some embodiments, the wave soldering apparatus 32 produces what is known as a miniwave 33 of molten solder material. To check the geometry of the miniwave 33 reliably (the main aspect may be the correct height of the miniwave 33), the wave soldering apparatus 32 can be brought up to a pin 17 of the measuring apparatus 14 from below, as depicted in FIG. 4. As soon as the miniwave 33 touches the applicable contact pin 17, the temperature therein quickly rises. This can be detected from the pin 17 conducting the heat to a temperature sensor of the measuring module 14. The pin 17 may be difficult to wet with solder material so that there is the assurance of the pin 17 not being wetted with solder material, since the measuring module is not intended to be soldered to the circuit carrier 13.

The exact position of the wave soldering apparatus 32 can be determined using a position or acceleration sensor 34, for example, this acceleration sensor 34 likewise able to communicate with the computer 25 via the interface 24. On the basis of the knowledge of the geometry of the miniwave and the exact position of the wave soldering apparatus 32, it is now possible to solder the two contact wires 21 of the element 19 from the underside of the circuit carrier 13, for example.

After finishing of the electronic subassembly on the circuit carrier 13, the measuring module 14 can be removed, since the connection to the circuit carrier 13 is breakable (connection produced by insertion). A further electronic module 35 is indicated, which can be accommodated in the slot instead. This may be a module that is used to monitor transport and operating conditions (temperature, moisture content, etc.), for example. Should a state arise, for example during transport, that is detrimental to the circuit carrier 13, this allows intelligent control to be used to take a counter measure (for example controlling the temperature of the transport space), or a value is stored in the other module 35 indicating that the suitability of the circuit carrier needs to be checked once again on account of the admissible transport conditions being overstepped.

Figure 5:
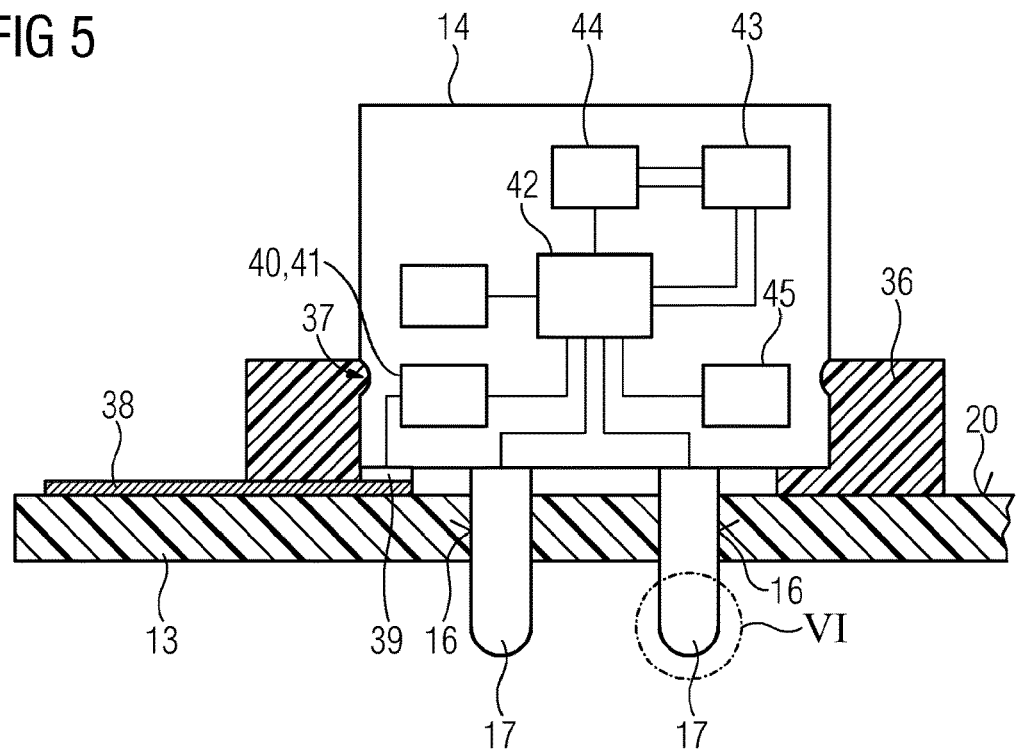

FIG. 5 depicts a detail from the subassembly with the measuring module 14. The circuit carrier 13 includes a printed circuit board. The measuring module has had the pins 17 inserted into the circuit carrier 13 through the holes 16. The measuring module 14 is fixed in a plug holder 36 in which a breakable, form-fit connection 37 can be made. Furthermore, the printed circuit board has a printed antenna provided on it as electronic component 38, which has contact made with it via a contact pad 39 of the measuring module 14. Therefore, the antenna can be used by an electronic transmission and reception module 40, 41 that, as indicated in FIG. 5, is electrically connected to the contact pad 39.

In some embodiments, the transmission and reception module 40, 41 (the transmission and reception module can also consist of a single transmission module and a reception module) is connected to a central control module 42. This control module 42 controls the process sequences in the measuring module 14. For this purpose, it is supplied with power via an energy source 43 in the form of a rechargeable battery (indicated by a two-wire line). The energy source 43 furthermore has an energy transducer 44 connected to it that can be used to charge the energy source 43 (indicated by a two-wire line). In this context, it is possible for mechanical energy to be converted into electrical energy or for thermal energy to be converted into electrical energy, for example. Hence, the energy source 43 and the energy transducer 44 are used to implement an autonomous energy source, so that the measuring module can be used independently of location without an external energy source. The energy transducer 44 is also actuated via the control module 42.

In some embodiments, the measuring module has a memory module 45 provided in it (and connected to the control module) that can be used to store measurement data or control data. These can be read via the component 38 (antenna) during the process itself. In some embodiments, these data are read after detachment of the measuring module 14 from the circuit carrier 13. In this context, it is possible to use the pins 17 in a suitable plug-in apparatus, for example. Alternatively, another interface integrated in the measuring apparatus can also be provided therefor.

Figure 6:
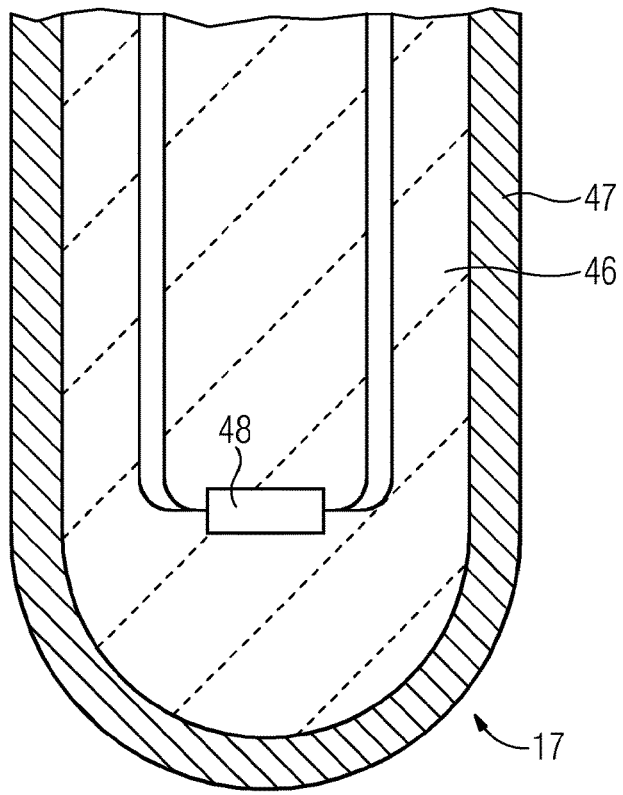
FIG. 6 shows a sectional view of the detail VI according to FIG. 5.

In some embodiments, during the process step, process variables are measured using the pins 17. These can be used in the manner described for FIGS. 2 and 4, for example. Firstly, the pins for making an electrical contact connection can form the electrodes, these being connected to the control module 42 for the purpose of transmitting the measured variables. The right-hand one of the two pins 17 is additionally in the form of a temperature sensor, as can be seen from the detail VI according to FIG. 6. In this case, it can be seen that the pin itself consists of an electrically nonconductive core 46 that has a metal layer 47. This layer 47 allows a contact connection according to FIG. 2, for example. Accommodated inside the core 46 is a thermocouple 48 that allows a temperature measurement according to FIG. 4.

What is claimed is:

1. A method for manufacturing an electronic circuit in a production installation, the method comprising:
    detachably connecting a circuit carrier to a measuring module before performance of a process step;
    performing a measurement with the measuring module during the performance of the process step;
    removing the measuring module from the circuit carrier after termination of the process step; and
    mounting an electronic module to the circuit carrier in a location of the measuring module after the measuring module has been removed from the circuit carrier;
    wherein the process step includes at least one step selected from the group consisting of: applying solder to the circuit carrier, fitting components to the circuit carrier, wetting the circuit carrier with a flux, and forming solder joints on the circuit carrier.

2. The method as claimed in claim 1, further comprising accessing an electronic component comprising part of the electronic circuit on the circuit carrier, by the measuring module during the process step.

3. The method as claimed in claim 1, further comprising producing measurement data with the measuring module during the measuring; and
    forwarding the measurement data to the production installation via an interface.

4. The method as claimed in claim 1, further comprising producing measurement data during the measurement with the measuring module;
    processing the measurement data; and
    forwarding a result of the processing as data describing the measurement result or control commands for influencing the at least one process step to the production installation via a data interface.

5. The method as claimed in claim 3, further comprising processing measurement data from a sensor outside the measuring module in the measuring module.

6. The method as claimed in claim 1, wherein the measuring module is secured by adhesive bonding, hook and loop fastening, insertion, or magnetic forces.

7. The method as claimed in claim 1, wherein the measuring module measures at least one of the group consisting of: a temperature, a position, and an acceleration.

* * * * *